United States Patent [19]

Hang et al.

[11] Patent Number: 4,830,988

[45] Date of Patent: May 16, 1989

[54] DIELECTRIC INKS FOR MULTILAYER COPPER CIRCUITS

[75] Inventors: Kenneth W. Hang, West Windsor Township, Mercer County; Ashok N. Prabhu, East Windsor Township, Mercer County; Wayne M. Anderson, Hamilton Township, Mercer County, all of N.J.

[73] Assignee: General Electric Company, Schenectady, N.Y.

[21] Appl. No.: 21,052

[22] Filed: Mar. 2, 1987

Related U.S. Application Data

[63] Continuation-in-part of Ser. No. 914,314, Oct. 2, 1986, abandoned.

[51] Int. Cl.$^4$ .................. B32B 3/00; B32B 9/00; C03C 10/02; B22F 7/00
[52] U.S. Cl. .................. 501/21; 501/10; 501/17; 501/20; 501/77; 428/210; 428/42 F; 428/901; 428/427; 428/432; 106/1.05; 106/1.13
[58] Field of Search .................. 501/10, 21, 77; 428/210, 428, 901, 432, 427; 106/1.05, 1.13

[56] References Cited

U.S. PATENT DOCUMENTS

| 3,022,179 | 2/1962 | Morrissey | 106/39 |
| 3,501,322 | 3/1970 | Dumbaugh et al. | 106/48 |
| 4,256,796 | 3/1981 | Hans et al. | 428/210 |
| 4,355,114 | 10/1982 | Hang et al. | 501/10 |
| 4,355,115 | 10/1982 | Hang et al. | 501/21 |
| 4,369,220 | 1/1983 | Prabhu et al. | 428/210 |
| 4,369,254 | 1/1983 | Prabhu et al. | 501/77 |
| 4,379,195 | 4/1983 | Prabhu et al. | 428/210 |
| 4,385,127 | 5/1983 | Chyung | 501/5 |
| 4,467,009 | 8/1984 | Prabhu et al. | 428/210 |
| 4,551,357 | 11/1985 | Takeuchi | 427/96 |

FOREIGN PATENT DOCUMENTS 174544 10/1984 Japan .

Primary Examiner—Ellis P. Robinson
Assistant Examiner—P. J. Ryan
Attorney, Agent, or Firm—James Magee, Jr.; James C. Davis, Jr.

[57] ABSTRACT

An improved dielectric ink for the fabrication of multilayer integrated circuits is disclosed. The subject inks comprise a devitrifying magnesium-barium-aluminum-zirconium-borophosphosilicate glass frit, an organic vehicle and, optionally, a suitable ceramic filler material. Dielectric layers and stand-alone substrates formed from the subject inks are characterized by good mechanical strength, heat resistance and exceptional density. The subject inks are particularly useful in the fabrication of multilayer circuit structures based on copper since their exceptional density renders them resistant to penetration by flux materials from the copper conductor layers.

10 Claims, 1 Drawing Sheet

DIELECTRIC INKS FOR MULTILAYER COPPER CIRCUITS

This invention relates to thick film dielectric materials and their use in fabricating multilayer electrical circuit structures, particularly copper-based structures.

RELATED APPLICATIONS

This application is a continuation-in-part of U.S. patent application Ser. No. 914,314, filed Oct. 2, 1986 now aband.

BACKGROUND OF THE INVENTION

The use of specialized ink formulations to form thick films having various functions on suitable substrates in the construction of multilayer integrated circuits is known in the art. Such technology is of increasing interest in the production of very dense multilayer circuit patterns on various substrates for a wide variety of applications in the electronics industry.

Thick film multilayer structures typically are comprised of at least two patterned layers of a conductor separated by a dielectric layer. The patterned conductor layers are connected by metallic conductor deposited in vias in the dielectric layer. Such structures are formed by multiple deposition and firing of layers of conductor and dielectric inks.

Such multilayer circuit structures utilizing copper as the conductor metal have a number of problems. The most common is failure caused by the development of electrical shorts due to penetration of the dielectric layers by flux components of the copper conductor ink, such as copper and bismuth oxides, which takes place during the multiple firings necessary to produce a multilayer circuit structure. When a conductive channel formed by the penetration of flux components passes completely through a dielectric layer and makes contact between an overlying and underlying copper conductor, an electrical short is produced.

A second problem common to multilayer circuits is porosity in the fired dielectric layers resulting from the evolution of gases from organic vehicle materils and/or oxides of bismuth and copper during firing. Contaminant materials e.g., molten eutectic phases from fired copper conductor layers, can readily leach into the resulting passages. The integrity of the dielectric layers in a multilayer structure is also important because the voids therein lower the resistance of the dielectric which is undesirable. It is conventional to print and fire at least two layers of dielectric ink between conductive layers to minimize the possibility that evolving gases will form connected passages through the dielectric.

It is possible to reduce the porosity of a dielectric material by formulating the ink with a higher quantity of glass frit. However, both this solution and the multiple print and fire approach can result in the trapping of gases within the dielectric layer. This will cause both the dielectric layer and overlying conductor layers to blister and peel. Added to these considerations is the fact that a vitreous glass can alter its viscosity in response to reactions with external flux phases, such as copper and bismuth oxides. Therefore, it becomes very difficult to predict whether a given glass/filler mixture will yield an impenetrable dielectric for multilayer applications. Such an improved dielectric is, however, provided in accordance with this invention.

SUMMARY OF THE INVENTION

Improved dielectric inks comprise a novel devitrifying magnesium-barium-aluminum-zirconium-borophosphosilicate glass and a suitable organic vehicle with, optionally, up to about 15 percent by weight of a ceramic filler. The inks are useful in the circuit structures, particularly those based on copper.

DETAILED DESCRIPTION OF THE INVENTION

Figure 1:
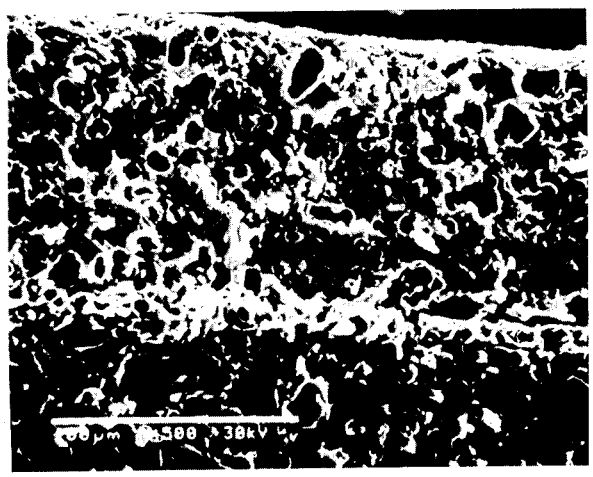
FIG. 1 is a photomicrograph of a cross-sectional view of a prior art structure consisting of a layer of commercial dielectric material separating two layers of copper conductor.

The novel dielectric inks of this invention are useful, for example, in the fabrication of multilayer integrated circuit structures. While the inks of this invention can be utilized in the fabrication of multilayer structures incorporating other metallic conductors, such as silver, they are particularly suited to the production of such structures based on copper conductors and will be so-described herein. The subject inks can likewise be utilized to form stand-alone substrates for a wide variety of electronic applications.

The subject inks are comprised of from about 60 to about 85 percent by weight of a glass frit, from about 15 to about 30 percent by weight of a suitable organic vehicle and up to about 15 percent by weight of a suitable ceramic filler. More preferred ink compositions contain from about 75 to 80 percent by weight of the glass frit with the remainder being the organic vehicle.

The glass frit of the inks of this invention consists of, on a weight basis:

(a) from about 25 to about 31 percent of magnesium oxide (MgO);

(b) from about 9 to about 18 percent of barium oxide (BaO);

(c) from about 10 to about 18 percent of aluminum oxide ($Al_2O_3$);

(d) from about 10 to about 15 percent of boron trioxide ($B_2O_3$);

(e) from about 24 to about 34 percent of silicon dioxide ($SiO_2$);

(f) from about 0.6 to about 0.8 percent of phosphorus pentoxide ($P_2O_5$);

(g) from about 2.5 to about 4.5 percent of zirconium silicate ($ZrSiO_4$);

(h) from 0 to about 2 percent of antimony trioxide ($Sb_2O_3$); and (i) from 0 to about 0.3 percent of cerium oxide ($CeO_2$). Although antimony trioxide and cerium oxide are optional ingredients, they are suitably either both present or absent from the frit. When they are present, antimony trioxide is suitably present in from about 0.1 to about 1.0 percent by weight and cerium oxide in from about 0.1 to about 0.3 percent by weight.

The glass frits are conventionally prepared by comminuting the various oxides, thoroughly mixing them in the appropriate proportion and melting the mixed oxides, e.g. in air, at 1450°–1600° C.

Preferred glass formulations in accordance with this invention contain, on a weight basis: from about 26.5 to about 30 percent of MgO; from about 11 to about 16 percent of BaO; from about 11 to about 14 percent of $Al_2O_3$; from about 11 to 14 percent of $B_2O_3$; from about 27 to 33 percent of $SiO_2$; from about 0.7 to about 0.77 percent of $P_2O_5$; and from about 3 to about 4 percent of $ZrSiO_4$.

For most applications, the subject inks comprise only the devitrifying glass frit and a suitable organic vehicle. The subject inks may, however, include up to about fifteen percent by weight of a conventional ceramic filler to adjust the thermal expansion match between the dielectric layer and substrate. For certain applications, such as the production of stand-alone substrates, the filler is included in the subject inks. When the subject inks contain a filler, it is suitably present in from about 7 to about 12 percent by weight. Suitable ceramic fillers in accordance with this invention include alumina ($Al_2O_3$), barium dimagnesium disilicate ($BaMg_2Si_2O_7$), dimagnesium borate ($Mg_2B_2O_5$), zirconium silicate ($ZrSiO_4$), dimagnesia silicate ($2MgO-SiO_2$), dimagnesia dialumina pentasilicate ($2MgO-2Al_2O_3-5SiO_2$), magnesium aluminate ($MgAl_2O_4$) and mixtures thereof.

In preparing the subject inks, the glass frit and the filler, if present, are ground to a particle size of from about 1-5 micrometers. The solid particles are combined with the organic vehicle and throughly mixed to make the ink. The organic vehicles are selected to give screen printing characteristics to the inks and to burn off cleanly in nitrogen or air, i.e. without leaving a carbonaceous residue.

The organic vehicles are solutions of resin binders such as, for example, cellulose derivatives, particularly ethyl cellulose, synthetic resins such as polyacrylates, polymethacrylates, polyesters, polyolefins and the like in a suitable solvent. A preferred binder is poly(isobutylmethacrylate). In general, conventional solvents utilized in inks of the type described herein may be used. Preferred commercially available solvents include, for example, pine oil, terpineol, butyl carbitol acetate, 2,2,4-trimethyl-1,3-pentanediol monoisobutyrate, available from Texas Eastman Company under the trademark Texanol, and the like. The vehicles suitably contain from about 5 to about 25 percent by weight of the resin binder. The vehicles also suitably contain from about 0.5 to about 10, preferably from about 1 to about 3, percent by weight of a suitable surfactant such as oleylamine, available as Armeen O or a high molecular weight N-alkyl-1,3-diaminopropane dioleate, available as Duomeen TDO, both from AKZO Chemie America.

The above resin binders may be utilized individually or in any combination of two or more. A suitable viscosity modifier can be added to the vehicle if desired. Such modifier can be, for example, a castor oil derivative available from NL Industries under the trademark Thixatrol. Regardless of the vehicle utilized, it is important that the homogeneity of the ink be maximized. Therefore, mixing is suitably carried out in a conventional apparatus which mixes in combination with subjecting the dispersion to high shearing action.

The dielectric inks of this invention are applied to substrate structures by conventional means, i.e. screen printing, brushing, spraying and the like with screen printing being preferred. Generally, as is conventional in the art, several individually dried and fired layers of dielectric are utilized to minimize the potential for through pinholes. The inks may also be applied to conventional release tape, dried and applied to the substrate as a layer. The layers may also be fired on a release surface, removed and utilized as stand-alone substrates. Other conventional methods of forming stand-alone substrates, such as injection molding, can also be utilized.

The coating of the ink is dried in air at 100°–125° C. for from 10 to 20 minutes and then fired in nitrogen at 850°–900° C. for from 5 to 15 minutes to form a dielectric layer comprising from about 75 to 100 percent by weight of the glass frit and up to about 25 percent by weight of the ceramic filler. It is preferred to treat the ink prior to firing with an oxidizing or reducing plasma at a temperature below the thermal decomposition temperature of the organic binder as disclosed by Prabhu et al. in U.S. patent application Ser. No. 815,076, filed Dec. 31, 1985, the disclosure of which is incorporated herein by reference. The plasma treatment, which is carried out in a conventional apparatus, removes trace residues of the organic binder.

The subject inks provide unexpectedly dense dielectric layers which have good mechanical strength and excellent reheat stability. The significant density, i.e. the reduced porosity, of dielectric layers formed from the subject inks renders them resistant to flux penetration. A further deterrent to flux penetration into the dielectric layer of this invention is the refractory nature of the crystalline microstructure thereof which is stable upon repeated firing above 900° C. Stand-alone substrates formed from the subject inks are useful in a wide range of applications in the same manner as conventional alumina circuit boards.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Glasses were prepared by weighing the component oxides, mixing and melting at about 1550° in air in platinum containers. The melts were quenched with dry counter-rotating ferrous metal rollers having a 0.01 inch gap. The coefficient of expansion of each glass formulation was determined utilizing a fused silica dilatometer. The coefficient of expansion of each glass formulation is given as alpha and was measured at 900° C. The alpha numbers represent a value $\times 10^{-7}$ cm per cm per degree Celsius.

| Constituent | Glass Formulation(Percent) | | | | | |
| --- | --- | --- | --- | --- | --- | --- |
|  | A | B | C | D* | E | F |
| MgO | 26.54 | 30.66 | 25.51 | 25.21 | 27.33 | 25.05 |
| BaO | 17.67 | 9.98 | 17.28 | 17.08 | 16.15 | 9.98 |
| $Al_2O_3$ | 11.63 | 10.50 | 12.94 | 12.79 | 12.94 | 17.43 |
| $B_2O_3$ | 14.37 | 11.22 | 13.47 | 13.31 | 14.05 | 11.22 |
| $SiO_2$ | 25.04 | 33.93 | 26.35 | 26.04 | 26.25 | 32.61 |
| $P_2O_5$ | 0.77 | 0.60 | 0.72 | 0.72 | 0.60 | 0.60 |
| $ZrSiO_4$ | 3.98 | 3.11 | 3.73 | 3.69 | 2.68 | 3.11 |
| Alpha | 83.2 | 87.0 | 76.5 | 86.5 | 82.0 | 65.0 |

*This formulaion additionaly contained 0.9 percent of $Sb_2O_3$ and 0.26 percent of $CeO_2$.

Inks were prepared by initially comminuting the glass ribbons formed by quenching the melts in a ball mill to achieve a mean particle size of about 5 micrometers. The glass formulations were combined with an organic vehicle in the ratio of 76.9 parts of glass to 23.1 of vehicle. The vehicle was comprised of a 20 percent solution of poly(isobutylmethacrylate) in Texanol and also contained one percent of the surfactant Duomeen TDO.

The dielectric ink ingredients were initially hand-mixed, then mixed on a three-roll mill to obtain a smooth paste available for screen printing. Additional solvent was added as necessary to assure proper rheology. The dielectric inks were individually printed onto conventional alumina circuit boards and air-dried at 125° for about 15 minutes. The coated substrates were placed in a conventional apparatus and subjected to an oxygen plasma for 120 minutes, after which the layers were fired in nitrogen at about 900° for 10 minutes. A second dielectric ink layer was printed and fired over the first in the same manner. Dielectric layers formed from inks containing glass formulations A and C demonstrated essentially a linear coefficient of expansion from 100° to 1000°. In contrast, a commercial dielectric ink preparation demonstrated a significant decline in expansion coefficient beginning at about 600°. The coefficient of expansion of the subject dielectric inks was advantageously close to and essentially parallel with that of the alumina circuit board substrate.

EXAMPLE 2

A copper conductor ink was prepared according to Prabhu et al. copending patent application entitled "Thick Film Conductor Inks", filed of even date herewith, the disclosure of which is incorporated herein by reference. The ink contained 77 parts of copper powder having an average particle size of 3 micrometers, 2 parts of bismuth oxide powder and 6 parts of a glass frit comprised of 52.5 percent of zinc oxide (ZnO), 25.4 percent of $B_2O_3$, 7.3 percent of $SiO_2$, 9.7 percent of lead oxide (PbO), 3.7 percent of $Al_2O_3$, 1.1 percent of $Sb_2O_3$ and 0.3 percent of $CeO_2$. The solid ingredients were mixed with 15 parts of an organic vehicle consisting of a 6 percent solution of ethyl cellulose in Texanol, additionally containing the wetting agents Hypothiolate 100 and Armeen O in concentrations of 17 percent and 3 percent, respectively, based on the vehicle. The ink was initially hand-mixed and then mixed on a three-roll mill to obtain a paste suitable for screen printing. Additional solvent was added as necessary to assure proper rheology.

The copper ink was printed onto a conventional alumina board to form a series of isolated parallel lines 375 micrometers wide separated by spaces of equal width. The copper ink was dried in air at 125° for 15 minutes and fired in nitrogen at 900° for 10 minutes. The substrate was entirely coated with the dielectric ink of Example 1 containing the glass of formulation A. Two layers of dielectric ink were applied, dried, plasma treated and fired as in Example 1. A top pattern of the copper ink was applied and fired as above.

As a control, a second alumina board was coated with copper, dielectric and copper inks as above utilizing the commercial copper conductor ink 5814 and the commercial dielectric ink 1903, both available from Remex, Inc.

Figure 2:
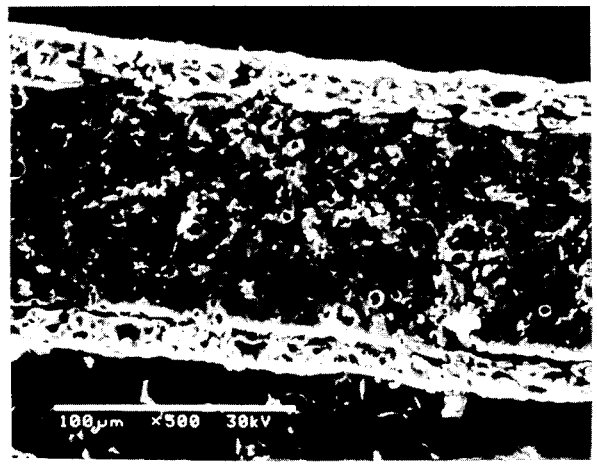
FIG. 2 is a photomicrograph of a cross-sectional view of a structure as shown in FIG. 1, but containing dielectric material formed from the inks of the present invention.

FIG. 1 is a micrograph of a cross section of the structure formed utilizing the commercial inks. The substantial porosity of the dielectric layer is readily apparent. In contrast, FIG. 2 is a photomicrograph of a cross section of the structure formed utilizing the dielectric ink of Example 1. The substantial reduction in porosity of the dielectric layer is apparent. The advantage of the subject dielectric inks is demonstrated by FIGS. 1 and 2.

EXAMPLE 3

The copper conductor ink of Example 2 was printed and fired onto a conventional alumina board to form a pattern as in Example 2. The dielectric ink of Example 1 containing glass formulation A was printed, dried, plasma treated and fired thereover. Openings or vias were left in the dielectric layer overlying a portion of the copper conductor.

A copper via-fill ink was prepared as follows: a devitrifying glass frit consisting of: 21.8 percent of ZnO, 16.5 percent of MgO; 7.8 percent of BaO; 39.2 percent of $SiO_2$; 10.7 percent of $Al_2O_3$; 1.0 percent of $P_2O_5$; and 3.0 percent of $ZrSiO_4$ and a vitreous glass frit consisting of: 51.59 percent of BaO, 12.58 percent of calcium oxide (CaO); 15.62 percent of $B_2O_3$; and 20.21 percent of $SiO_2$ were separately prepared and reduced to a particle size of about three micrometers. Solid ingredients consisting of 65 percent of copper powder having an average particle size of three micrometers, 14 percent of the devitrifying glass frit and 4 percent of the vitreous glass frit were thoroughly mixed by hand.

The solid ingredients were mixed with 17 parts of an organic vehicle consisting of a 20 percent solution of poly(isobutylmethacrylate) in Texanol additionally containing, as wetting agents, 17 percent of Hypothiolate 100 and 3 percent of Armeen O. The ink was initially hand-mixed and then mixed on a three-roll mill to obtain a paste suitable for screen printing. Additional solvent was added as necessary to assure proper rheology. The via-fill ink is described in a copending patent application of Prabhu et al. entitled "Thick-Film Copper Via-Fill Inks", Ser. No. 914,296, filed Oct. 2, 1986.

The via-fill ink was printed into the spaces in the dielectric ink, dried in air at 125° for 15 minutes and fired in nitrogen at 900° for 10 minutes. The thickness of the dielectric/copper via-fill was 15 micrometers. The dielectric/copper via-fill depositions were repeated three times to form a final thickness of 45 micrometers. A layer of the copper conductor ink of Example 2 were deposited and fired over the structure so that a portion was in contact with the copper via-fill. This procedure was repeated three times to obtain a multilayer copper-based device having four buried copper layers. In total, 25 firings were required to complete the multilayer circuit.

The structure was biased through electrical contacts made to the copper layers. No evidence of shorting or loss of contact was observed in any of the copper layers.

We claim:

1. A dielectric ink for multilayer integrated circuit fabrication comprising:
   (a) from about 60 to about 85 percent by weight of a glass frit comprising, on a weight basis: from about 25 to about 31 percent of magnesium oxide; from about 9 to about 18 percent of barium oxide; from about 10 to about 18 percent of aluminum oxide; from about 10 to about 15 percent of boron trioxide; from about 24 to about 34 percent of silicon dioxide; from about 0.6 to about 0.8 percent of phosphorus pentoxide; from about 2.5 to about 4.5 percent of zirconium silicate; from 0 to about 2 percent of antimony trioxide; and from 0 to about 0.3 percent of cerium oxide;
   (b) up to about 15 percent by weight of a ceramic filler; and (c) from about 15 to about 30 percent by weight of a organic vehicle.

2. A dielectric ink in accordance with claim 1, wherein the glass frit contains from about 0.1 to about 1.0 percent by weight of antimony trioxide and from about 0.1 to about 0.3 percent by weight of cerium oxide.

3. A dielectric ink in accordance with claim 1, wherein the glass frit companies, on a weight basis: from about 26.5 to about 30 percent of magnesium oxide; from about 11 to about 16 percent of barium oxide; from about 11 to about 14 percent of aluminum oxide; from about 11 to about 14 percent of boron trioxide; from about 27 to about 30 percent of silicon dioxide; from about 0.7 to about 0.77 percent of phosphorus pentoxide; and from about 3 to about 4 percent of zirconium silicate.

4. A dielectric ink in accordance with claim 1, wherein the ink contains from about 7 to about 12 percent by weight of the filler.

5. A dielectric ink in accordance with claim 4, wherein the filler is selected from the group consisting of alumina, barium dimagnesium disilicate, dimagnesium borate, zirconium silicate, dimagnesia silicate, dimagnesia dialumina pentasilicate, magnesium aluminate and mixtures thereof.

6. A dielectric ink in accordance with claim 5, wherein the filler material is alumina.

7. A dielectric ink in accordance with claim 1, wherein the organic vehicle comprises a solution of an organic binder in a solvent.

8. A dielectric ink in accordance with claim 7, wherein the organic binder is poly(isobutylmethacrylate).

9. A dielectric ink in accordance with claim 7, wherein the vehicle contains a surfactant.

10. A dielectric ink in accordance with claim 9, wherein the surfactant is oleylamine or a high molecular weight N-alkyl-1,3-diaminopropane dioleate.

* * * * *